(12) United States Patent
Jungerman

(10) Patent No.: US 7,545,858 B2
(45) Date of Patent: Jun. 9, 2009

(54) METHOD OF MEASURING JITTER FREQUENCY RESPONSE

(75) Inventor: Roger L. Jungerman, Petaluma, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 942 days.

(21) Appl. No.: 10/880,038

(22) Filed: Jun. 29, 2004

(65) Prior Publication Data

US 2005/0286670 A1 Dec. 29, 2005

(51) Int. Cl.
*H04B 3/46* (2006.01)
*H04L 7/00* (2006.01)
(52) U.S. Cl. ...................... 375/226; 375/371
(58) Field of Classification Search .................. 375/226, 375/326, 327, 371, 373, 376; 702/69, 76, 702/77, 78
See application file for complete search history.

(56) References Cited

U.S. PATENT DOCUMENTS

| | | | | |
|---|---|---|---|---|
| 5,208,833 A | * | 5/1993 | Erhart et al. | 375/294 |
| 5,481,563 A | * | 1/1996 | Hamre | 375/226 |
| 6,239,848 B1 | * | 5/2001 | Mycynek et al. | 348/678 |
| 2005/0185748 A1 | * | 8/2005 | Wahi et al. | 375/376 |

* cited by examiner

Primary Examiner—Young T. Tse

(57) ABSTRACT

A method of measuring jitter frequency response includes recovering a clock signal from a data input stream to provide a recovered clock signal and counting the recovered clock signal over a selected time period to provide a recovered clock count. A reference signal is counted over the selected time period to provide a reference signal count. The recovered clock count is compared to the reference signal count and a frequency of the recovered clock signal for the selected time period is calculated.

20 Claims, 2 Drawing Sheets ically occurs at high frequencies. Jitter in a digital system is essentially a timing error that can affect the timing allocation within a bit cell. Jitter is typically measured at the differential zero crossings for balanced electrical signals, at the average voltage level for unbalanced signals, and at the average optical power level for optical signals. Jitter is often used as a figure of merit, and tracking jitter-induced errors over a period of time can provide an indication of system stability.

METHOD OF MEASURING JITTER FREQUENCY RESPONSE

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO MICROFICHE APPENDIX

Not applicable.

BACKGROUND OF THE INVENTION

Jitter is the deviation from an ideal timing edge of the actual timing edge in a sequence of data bits that typically occurs at high frequencies. Jitter in a digital system is essentially a timing error that can affect the timing allocation within a bit cell. Jitter is typically measured at the differential zero crossings for balanced electrical signals, at the average voltage level for unbalanced signals, and at the average optical power level for optical signals. Jitter is often used as a figure of merit, and tracking jitter-induced errors over a period of time can provide an indication of system stability.

There are various types of jitter, such as random jitter, periodic jitter, and data-dependent jitter ("DDJ"). DDJ produces different amounts of jitter for different digital outputs. For example, a digital output of "00010001" would have a different amount of DDJ than a digital output of "10101010" from the same digital source because the latter digital output has more transitions, and hence contains more high-frequency components in its spectrum. The digital patterns with higher frequency content will be attenuated and phase shifted relative to the lower frequency patterns. Determining the level(s) and type(s) of jitter are important in characterizing components used in digital systems. In general, digital systems having higher transmission rates (typically expressed in Mb/s or Gb/s) have timing margins that are less tolerant to jitter.

In telecommunications (e.g. SONET, SDH. or OTN) and enterprise (e.g. Ethernet) applications, jitter specifications and measurements are documented through standards bodies. In the high-speed I/O arena, many new bus standards are being introduced with little commonality in specifying and measuring jitter. Similarly, characterization of high-speed serial electrical backplanes is gaining increased attention as their use increases for high-bandwidth interconnections. Jitter is often the limiting factor for electrical backplanes operating in the 1-10 Gb/s range. Measuring the jitter on a data stream is desirable in order to characterize digital designs.

BRIEF SUMMARY OF THE INVENTION

A method of measuring jitter frequency response includes recovering a clock signal from a data input stream to provide a recovered clock signal and counting the recovered clock signal over a selected time period to provide a recovered clock count. A reference signal is counted over the selected time period to provide a reference signal count. The recovered clock count is compared to the reference signal count and a frequency of the recovered clock signal for the selected time period is calculated.

DETAILED DESCRIPTION OF THE EMBODIMENTS

I. An Exemplary Jitter Reference Source

Figure 1:
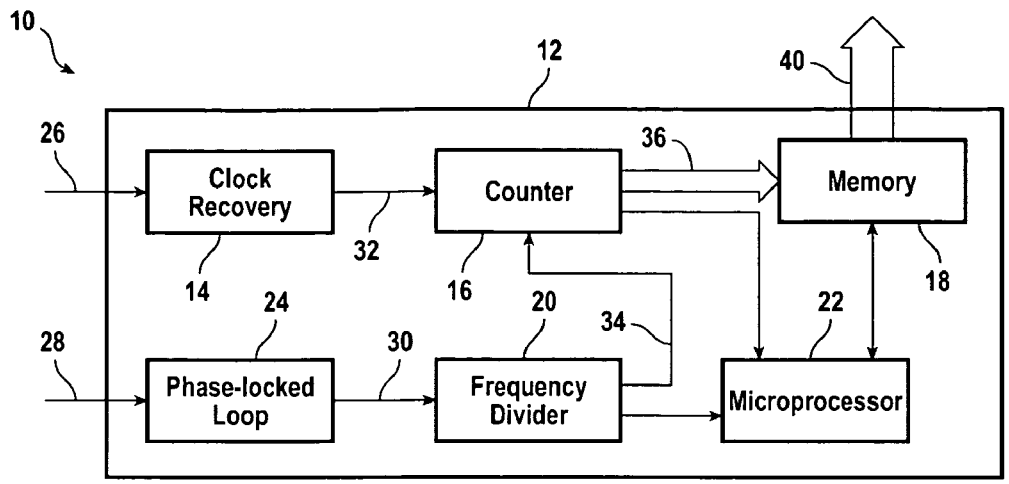
FIG. 1 shows a circuit according to an embodiment of the present invention.

FIG. 1 shows a jitter measurement system 10 according to an embodiment of the present invention. The jitter measurement system is embodied as an integrated circuit 12 ("IC"), such as an application-specific integrated circuit ("ASIC") or as a portion of an IC used in a digital communications analyzer ("DCA"), for example. Alternatively, a jitter measurement system is embodied on a printed wiring board or as a hybrid microcircuit, or it is configured in the fabric of a programmable logic device, such as a field-field-programmable gate array, or is embedded in a programmable logic device, or some portions are embedded and others are configured in a programmable logic device.

The jitter measurement system 10 includes a clock recovery circuit 14, a counter 16, a memory 18, a frequency divider 20, a microprocessor 22, and a phase-locked loop ("PLL") 24. Data 26 (also known as a data input stream) is provided to the clock recovery circuit 14 at a data rate, such as at nominally 10 Gbits/sec.

The data rate typically varies slightly for a variety of reasons. One source of variation arises from jitter. Jitter causes the data edge to occur sooner or later than would be expected when compared to a hypothetical perfect clock signal. There are many types of jitter, and different types of jitter can affect the data rate in different ways. For example, periodic jitter frequency-modulates ("FM's") the instantaneous frequency of a clock source (not shown) in some applications, and hence the data source (also not shown). Clock oscillator drift can similarly cause the data rate to vary. In some applications, such as applications using spread-spectrum clocking, the clock rate is intentionally dithered.

There are typically different amounts of jitter at different data clock offset frequencies. Measuring the frequency content of jitter is desirable for evaluating performance of a digital system, such as a serial electrical backplane, either during operation, or to evaluate a digital design or component.

Jitter that occurs at a frequency within the tracking bandwidth of the clock recovery circuit 14 is tracked by the clock recovery circuit 14. An exemplary clock recovery circuit operates over a range of clock frequencies about 2.4 GHz to about 10.7 GHz and has a tracking bandwidth of about 8 MHz. It is highly desirable to be able to measure the frequency spectrum of jitter. In the case of periodic jitter, different frequency components in a jittered signal can be separated, and possibly identified, by analyzing jitter frequency.

DCAs have become widely accepted for making high-speed data-dependent jitter and random jitter measurements. The jitter measurement system 10 shown in FIG. 1 enables a simple method and apparatus for measuring jitter frequency.

In a particular embodiment, the jitter measurement system 10 is incorporated in an IC used in a DCA.

A reference signal 28 is provided to the PLL 24. The reference signal 28 is typically a relatively low-frequency signal, such as a 10 MHz signal. The PLL 24 multiplies the reference signal 28, in this case by a factor of 1,100, to generate a high-frequency reference signal 30, which in this example is at 11 GHz. For purposes of this application, "high-frequency," as applied to reference signals, means that the frequency of the high-frequency reference signal is about the same, and typically greater than, the nominal clock rate of the data 26.

The clock recovery circuit 14 generates a recovered clock signal 32 that is nominally 10 GHz; however, the recovered clock signal tracks deviations in the clock frequency ($\Delta f_{clock}$) in the data 26 ("data input stream") if the deviations are within the bandwidth of the clock recovery circuit. In a particular embodiment, the clock recovery circuit 14 has a bandwidth greater than the highest clock frequency that is expected to be measured (i.e. the nominal clock frequency plus the highest expected $\Delta f_{clock}$). Since many systems and components have a maximum jitter specification, the desired bandwidth of the clock recovery circuit 14 can be determined. In some embodiments, the bandwidth of the clock recovery circuit 14 is greater than a bandwidth of a component to be used in a digital system being tested. In an alternative embodiment, a high-frequency reference clock signal is provided to the circuit 10, and the PLL 24 is omitted.

The goal is to accurately count transitions in the recovered clock signal 32 over a time period. The reference signal provides an accurate time base from which the desired time period is created. In a particular embodiment, the frequency comparison is performed in repetitive fashion so that a transform, such as a fast Fourier transform ("FFT"), can be employed to extract the frequency spectrum ("frequency content") of the recovered clock signal and hence the jitter in the data stream. Alternatively, a discrete Fourier transform or other transform or power spectral density technique is used to extract the frequency content of the recovered clock signal. In a particular embodiment, the counter 16 is designed to be flexible so that the amount of memory used, dynamic range, and frequency coverage can be adjusted for different circumstances. If the high-frequency reference clock signal 30 is chosen to be greater than the highest frequency in the recovered clock signal 32, or at least higher than the highest instantaneous clock frequency (i.e. nominal clock frequency plus the highest $\Delta f_{clock}$) that is desired to be measured, then at most one clock recovery cycle per a selected number reference cycles is obtained. This relationship between the clock recovery period and the period of the high-frequency reference signal enables using counters, rather than a more complicated accumulator, to determine the instantaneous clock recovery frequency. In an alternative embodiment, accumulators are used instead of the counter 16.

The counter 16 is gated for several periodic intervals by a divided high-frequency reference signal 34 generated by the frequency divider 20. Thus, the counter 16 samples the accumulated phase of the recovered clock signal 32 (which is counted in integer cycles by separate, parallel, individual counters (not shown) in the counter 16). The recovered clock interval is divided into several separate counts. Averaging the separate counts in the final FFT improves the dynamic range of the measurement. There are trade-offs between the amount of memory required to store counts, the number of segmented counter registers, and the number of points in the FFT, which affects computation time and memory usage in the circuit 10. In an alternative embodiment, the frequency divider 20 is omitted, and the high-frequency reference signal from the PLL 24 or alternatively from an on-chip high-frequency reference signal source (not shown) or an off-chip high-frequency reference signal source (not shown) is used to gate the counter 16 and provide an accurate time base for counting the recovered clock signal 32.

In a particular example, a high-frequency reference signal 30 at 11 GHz is divided by a factor of thirty-two in the frequency divider 20 to gate each of sixteen separate counters (not separately shown) in the counter circuit 16, each of the sixteen separate counters have five bits to accommodate a highest possible count of thirty-two, a maximum of one count per high-frequency reference cycle. Each of the sixteen counter values 36 are put into the memory 18 to be read by the microprocessor 22. In some embodiments, the high-frequency reference signal 30 is above the operating frequency of the counter 16 in the IC 12. Dividing the high-frequency reference signal 30 in these embodiments also provides a divided high-frequency reference signal within the operating range of the counter 16 in the IC.

In a specific embodiment, the bandwidth of the clock recovery circuit 14 is 10 MHz and is designed to be adjustable (e.g. the clock recovery circuit recovers clock signals between 9.995 GHz and 10.005 GHz for a nominal recovered clock frequency of 10 GHz). Alternative embodiments use other bandwidths, which are adjustable or non-adjustable. The sample interval in the FFT is 11 GHz divided by thirty-two, which gives a sample rate of 344 mega-samples per second (MS/s). According to Nyquist theory, this sample rate allows measurement of frequencies up to 172 MHz (344 MS/s divided by two). Frequencies above 10.005 GHz contain no useful information because they are outside of the clock recovery bandwidth and coherent averaging is achieved by filtering out ("windowing out") the data associated with these higher frequencies. The data for frequencies above the clock recovery bandwidth (e.g. from 10 MHz to 172 MHz) contain noise that can affect all recovered clock (jitter response) frequencies, even recovered clock frequencies below 10 MHz when transform is applied to the data to extract the jitter frequency response. Filtering out frequencies that are outside of the operating range of the clock recovery circuit can also significantly improve the dynamic range of the jitter frequency measurement. In a particular embodiment, after the high-frequency spectral components that are to be filter out in the frequency domain, a re-transform is applied to the frequency data to obtain time-domain data, and the undesirable data is filtered in the time domain.

In this example, the jitter measurement bandwidth is filtered down to about 172 MHz divided by sixteen (the number of counters in the counter circuit 16), which equals 10.7 MHz, which is essentially the bandwidth of the clock recovery circuit 14, and the dynamic range is improved to eleven bits (−66 dB). The lowest frequency point is set by the number of points. With 8,192 points in the filtered waveform, a lower frequency of 10.7 MHz divided by 8,192 points results in a lower frequency limit of 1.3 kHz. The total FFT length is 8,192 points times the sixteen separate counters in the counter circuit 16, or 131,072 points. This example results in a relatively large number of points being stored, but the FFT can be computed in a relatively short time with good accuracy compared to storing fewer points having greater intervals. The total memory usage is five bits per counter times sixteen counters, times 8,192 points, or 655 kbits.

In another embodiment, four twelve-bit counters are used in a low-frequency band measurement. There are 8,192 measurement points, as in the preceding example. The upper frequency is 83 kHz, the lower frequency is 10 Hz, and the dynamic range is 14 bits (−84 dB). This results in a memory usage of 524 kbits. Low-frequency band measurements are especially desirable for measuring clock dithering, which is common in some serial bus protocols, such as a PCI EXPRESS protocol, and spread-spectrum clocking applications.

The above two embodiments illustrate how memory can be allocated as required for the desired frequency response measurement. The same physical memory, when not being used for a frequency response measurement, can typically be used for data capture, pattern matching, or other uses in the IC 12 or other circuit in high-speed serial bus trigger applications. The memory can be coupled to another circuit over a universal serial bus ("USB") 40 or other interface, for example.

Generally, the counter 16 counts the number of clock pulses, M, on the recovered clock signal 32 that occur over a fixed time period ($\Delta t$), and also the number of pulses, N, on the reference signal over the same period of time, where M and N are integers returned from individual counters (not separately shown) in the counter 16. It is desirable in some embodiments to have a reference signal at about the same frequency as the input data rate (i.e. nominal recovered clock frequency), for example, using a reference signal at 11 GHz with a recovered clock signal at nominally at 10 GHz. This allows accurate measurement (e.g. having an error of about ±1 clock cycle per sample time period) of the recovered clock signal without using undue amounts of memory. More cycles on the reference clock signal compared to the recovered clock signal provides greater accuracy, but uses more system resources. The average instantaneous frequency of the recovered clock signal over the sample time period (e.g. about 1 nano-second ("ns") in a particular embodiment) is determined from the number of recovered clock pulses counted and the number of transitions of the reference signal counted.

In a particular application, the counter counting the recovered clock signal is gated by the reference signal. In other words, the recovered clock signal counter stops counting when a certain number of transitions on the reference signal has occurred. For example, with a nominal recovered clock signal frequency of about 10 GHz, approximately 10 counts will occur over a sample time period of 1 ns. The product of the number of points times the sample time interval is known as the "span" of the measurement, and sets the resolution of an optional FFT performed a periodic series of counts. Continuing the example using a maximum jitter bandwidth of 10 MHz, sampling the average instantaneous frequency of the recovered clock signal at 20 MHz provides an accurate reconstruction of the frequency spectrum of the jitter, according to Nyquist theory. It is noted that this example provides ample opportunity for over-sampling, and that higher frequencies of jitter can be measured by increasing the bandwidth of the clock recovery circuit 14, which is programmable in some embodiments.

As an alternative to increasing the frequency of the high-frequency reference signal, higher accuracy can also be obtained by increasing the time period, $\Delta t$, over which the recovered clock signal and the high-frequency reference signal are counted. Increasing the time period increases the number of clock cycles counted over an interval; however, increasing the time period can result in a loss of the higher frequency components returned from the FFT. Thus, it is desirable in some embodiments to provide dynamic adjustment of the time period.

Figure 2:
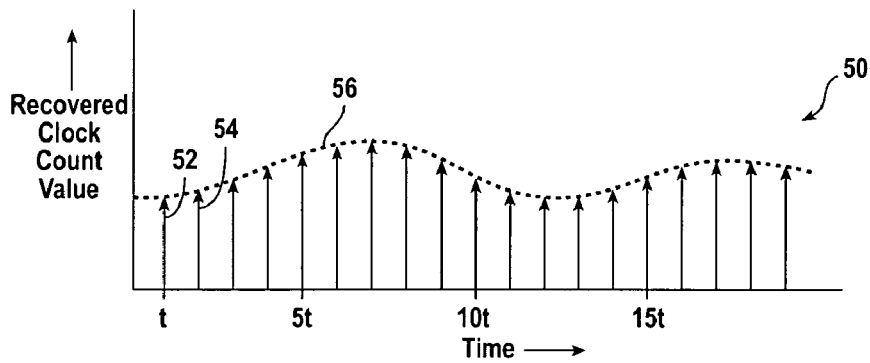
FIG. 2 shows a plot of the instantaneous recovered clock frequency, represented as a count value, versus time.

FIG. 2 shows a plot 50 of the instantaneous recovered clock frequency, represented as the count value, versus time. The recovered clock signal is measured (counted) over a sample time period ($\Delta t$, e.g. 1 ns) for several intervals (t), typically of fixed duration in a periodic, repetitive fashion (e.g. at 20 MHz, or every 100 ns). In other words, the recovered clock signal is counted over the same time interval and the instantaneous recovered clock frequency is represented by arrows 52, 54 spaced 100 ns apart. The height of the arrows indicates the integer count of the recovered clock signal and thus represents the average instantaneous recovered clock frequency over the sample time period. However, significant variations of the clock frequency within the sample time period do not typically occur, and if they do occur, are at very high frequencies relative to the clock recovery bandwidth. In an alternative embodiment, the sampled data (counts) are normalized to a nominal clock recovery frequency (e.g. 10 GHz), which can be expressed as a recovered clock offset frequency.

The high-frequency reference signal (e.g. 11 GHz) provides a time base for accurately measuring the average instantaneous frequency (i.e. the average over the sample time period) of the recovered clock signal, which is compared to the nominal clock frequency (e.g. 10 GHz) to obtain the instantaneous recovered clock frequency. For example, a clock offset frequency is obtained by calculating the ratio of M/N for a sample time interval ($\Delta t$), and comparing that ratio to the ratio expected over the same time interval for a clock signal with no offset (i.e. no net jitter). Alternatively, the average instantaneous frequency of the recovered clock signal is represented as a count value, without being normalized to the nominal clock frequency.

The arrows define a piece-wise envelope, represented by a dashed line 56, that shows the variation of the clock frequency over time. Applying an FFT to this envelope 56 provides a jitter frequency spectrum of the recovered clock signal, and hence the jitter frequency spectrum of the data 26.

II. Exemplary Methods

Figure 3A:
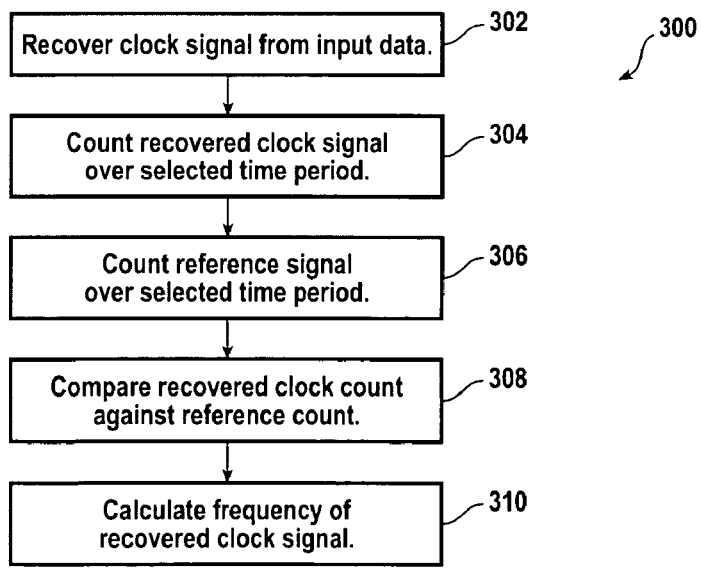
FIG. 3A is a flow chart of a method of measuring the instantaneous jitter frequency in a data signal.

FIG. 3A is a flow chart of a method 300 of measuring the instantaneous jitter frequency in a data signal. A clock signal is recovered from a data signal (input data stream) to provide a recovered clock signal (step 302). A reference signal is provided by a high-frequency reference source, or is provided by multiplying a low-frequency reference signal to obtain the reference signal. The recovered clock signal is counted over a sample time period (step 304) to provide a recovered clock signal count, and the reference signal is counted over the selected time period (step 306) to provide a reference signal count. The recovered clock signal count is compared against the reference clock signal count (step 308) and the effective instantaneous frequency of the recovered clock signal is calculated (step 310).

Figure 3B:
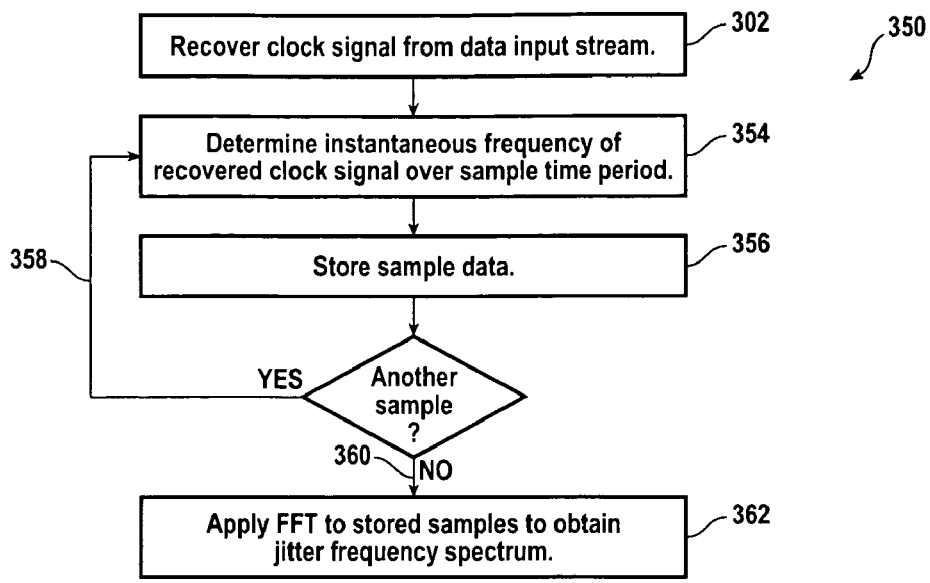
FIG. 3B is a flow chart of a method of measuring the frequency content of jitter in a data signal.

FIG. 3B is a flow chart of a method 350 of measuring the frequency content of jitter in a data signal. A clock signal is recovered from a data input stream to provide a recovered clock signal (step 302). An instantaneous frequency of the recovered clock signal is determined over a sample time period (step 354). The instantaneous recovered clock offset frequency is the net $\Delta f_{clock}$, or "average" instantaneous recovered clock offset frequency, over the sample time period. The instantaneous frequency for the recovered clock signal over the sample time period is stored (step 356) and the recovered clock signal is sampled over additional periodic sample time periods (branch 358) until a suitable number of instantaneous frequencies ("samples") of the recovered clock signal are stored (branch 360). An FFT is applied to the stored samples to obtain the jitter frequency spectrum of the recovered clock signal (step 362), which represents the jitter frequency spectrum of the incoming data. In a particular embodiment, 1024 samples are stored, which gives a reasonably accurate characterization of the jitter frequency spectrum without consuming too many system resources, such as memory and processing time. In a particular embodiment, the bandwidth of the clock recovery circuit 14 and the sampling period and interval are selected to provide a jitter frequency spectrum that extends beyond (i.e. has a higher measured jitter frequency limit) a maximum jitter specification for the data input stream 26.

Figure 3C:
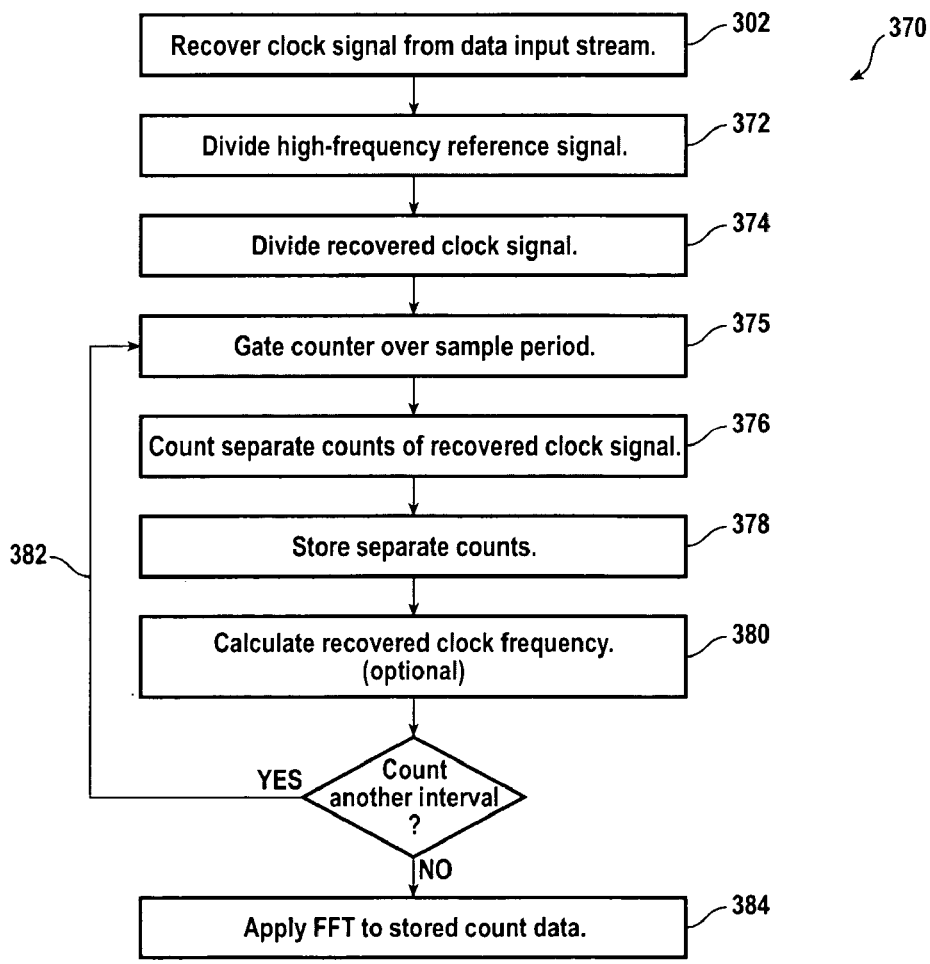
FIG. 3C is a flow chart of another method of measuring the frequency content of jitter in a data signal.

FIG. 3C is a flow chart of another method 370 of measuring the frequency content of jitter in a data signal. A clock signal is recovered from input data (input data stream) to provide a recovered clock signal (step 302). A high-frequency reference signal is divided to obtain a divided reference signal (e.g. divided high-frequency reference signal 34 shown in FIG. 1) (step 372). The recovered clock signal is divided into a plurality of segments (step 374) to be counted by a corresponding plurality of individual counters. Each of the plurality of individual counters is gated over a sample period (step 375) to count each of the plurality of segments and provide a corresponding plurality of separate integer counts (step 376). Each of the plurality of separate integer counts is stored in memory (step 378). In a particular embodiment, the sample period is determined by counting the transitions in the divided reference signal with a counter. In an alternative embodiment, each of the plurality of separate integer counts is averaged and the average count is stored in memory.

The instantaneous frequency of the recovered clock, or alternatively the clock offset frequency, over the sample period is optionally calculated (step 380). Alternatively, the separate integer counts obtained over a periodic interval are stored without averaging the separate integer counts. The recovered clock signal is counted over several periodic intervals (branch 382) to provide a plurality of clock frequency counts or alternative clock frequencies or clock offset frequencies. In one embodiment, a clock frequency count is a plurality of separate counts over a sample period. In another embodiment, a clock frequency integer count is an average of a plurality of separate counts taken over a sample period.

After the recovered clock signal has been counted over a sufficient number of periodic intervals, an FFT is applied (step 384) to obtain the amplitude versus frequency (i.e. jitter frequency spectrum) of the recovered clock signal. Since the recovered clock signal represents the timing in the incoming data, the jitter frequency spectrum of the recovered clock signal represents the jitter frequency spectrum of the incoming data. In an alternative embodiment, the effective instantaneous frequency of the recovered clock signal is not separately calculated between intervals, and the FFT reads the data from the counts for several periodic intervals to obtain the jitter frequency response. In a particular embodiment, the FFT averages the data from the separate counts over a sample period, which can improve the dynamic range of the jitter frequency response measurement.

While the preferred embodiments of the present invention have been illustrated in detail, it should be apparent that modifications and adaptations to these embodiments might occur to one skilled in the art without departing from the scope of the present invention as set forth in the following claims.

What is claimed is:

1. A method, comprising:
   recovering a clock signal from a data input stream to provide a recovered clock signal;
   counting the recovered clock signal over a sample time period to provide a recovered clock count;
   counting a reference signal over the sample time period to provide a reference signal count;
   comparing the recovered clock count to the reference signal count; and
   calculating a frequency of the recovered clock signal over the sample time period.

2. The method of claim 1 wherein the reference signal has a reference signal frequency greater than a recovered clock signal frequency.

3. The method of claim 1 wherein the data input stream is provided to an integrated circuit, and the steps of counting the recovered clock signal, counting the reference signal, and comparing the recovered clock count to the reference signal count are performed by the integrated circuit.

4. The method of claim 1 further comprising, prior to the step of recovering the clock signal, adjusting a clock recovery bandwidth of a clock recovery circuit.

5. The method of claim 4 wherein the data input stream has a maximum jitter frequency specification and a nominal clock frequency, and the clock recovery bandwidth is adjusted to be not less than a sum of the nominal clock frequency and the maximum jitter frequency specification.

6. The method of claim 1 further comprising, prior to the step of counting the recovered clock signal over the sample time period, selectively adjusting the sample time period.

7. The method of claim 1 further comprising:
   providing an input signal having a frequency which is lower than a frequency of the reference signal; and
   multiplying the frequency of the input signal by a numerical factor to obtain the reference signal.

8. The method of claim 7 wherein the data input stream and the input signal are provided to an integrated circuit, and the steps of multiplying the frequency of the input signal by the numerical factor counting the recovered clock signal, counting the reference signal, and comparing the recovered clock signal are performed by the integrated circuit.

9. The method of claim 1 wherein the data input stream has a maximum jitter specification and a jitter frequency response of the data input stream extends beyond the maximum jitter specification.

10. The method of claim 1 further comprising:
    storing the frequency of the recovered clock signal over the sample time period;
    repeating the steps of calculating the frequency of the recovered clock signal and storing the frequency of the recovered clock signal over a plurality of sample time periods to obtain a selected number of samples; and
    applying a transform to the selected number of samples to obtain a jitter frequency spectrum of the data input stream.

11. The method of claim 10 wherein the data input stream is provided to an integrated circuit, and the steps of counting the recovered clock signal, counting the reference signal, comparing the recovered clock count to the reference signal count, and storing the frequency of the recovered clock signal are performed by the integrated circuit.

12. The method of claim 10 wherein the reference signal has a reference signal frequency greater than the recovered clock signal frequency.

13. The method of claim 10 further comprising, prior to the step of recovering the clock signal, adjusting a clock recovery bandwidth of a clock recovery circuit.

14. The method of claim 13 wherein the data input stream has a maximum jitter frequency specification and a nominal clock frequency, and the clock recovery bandwidth is adjusted to be not less than a sum of the nominal clock frequency and the maximum jitter frequency specification.

15. The method of claim 14 further comprising, prior to the step of counting the recovered clock signal over the sample time period, selectively adjusting the sample time period.

16. The method of claim 10 further comprising:
providing an input signal having a frequency which is lower than a frequency of the reference signal; and
multiplying the frequency of the input signal by a numerical factor to obtain the reference signal.

17. The method of claim 16 wherein the data input stream and the signal are provided to an integrated circuit, and the steps of multiplying the frequency of the input signal by the numerical factor counting the recovered clock signal, counting the reference signal, and comparing the recovered clock count to the reference signal count are performed by the integrated circuit.

18. The method of claim 10 further comprising, prior to the step of counting the recovered clock signal over the sample time period, selectively adjusting the sample time period.

19. The method of claim 1 wherein the reference signal is a high-frequency reference signal and further comprising:
dividing the high-frequency reference signal to provide a divided reference signal;
dividing the recovered clock signal into a plurality of segments;
gating a plurality of counters with the divided reference signal over the sample time period, wherein the step of counting the recovered clock signal comprises counting the plurality of segments to provide a plurality of separate counts over the sample time period;
storing the plurality of separate counts;
periodically repeating the steps of gating, counting the plurality of segments to provide the plurality of separate counts over the sample time period, and storing a selected number of times to provide a plurality of periodic recovered clock counts; and
applying a transform to the plurality of periodic recovered clock counts to obtain a jitter frequency response of the data input stream.

20. The method of claim 19 further comprising, prior to the step of recovering the clock signal,
adjusting a clock recovery bandwidth of a clock recovery circuit to be not less than a sum of a nominal clock frequency and a maximum jitter specification of the data input stream;
multiplying a frequency of a low-frequency reference signal by a numerical factor to obtain the high-frequency reference signal; and
selectively adjusting the sample time period.

* * * * *

UNITED STATES PATENT AND TRADEMARK OFFICE
CERTIFICATE OF CORRECTION

PATENT NO.        : 7,545,858 B2
APPLICATION NO. : 10/880038
DATED             : June 9, 2009
INVENTOR(S)       : Roger L. Jungerman It is certified that error appears in the above-identified patent and that said Letters Patent is hereby corrected as shown below:

In column 8, line 33, in Claim 8, delete "factor" and insert -- factor, --, therefor.

In column 9, line 11, in Claim 17, delete "the signal" and insert -- the input signal --, therefor.

In column 9, line 13, in Claim 17, delete "factor" and insert -- factor, --, therefor.

Signed and Sealed this

Twenty-fourth Day of November, 2009

David J. Kappos
*Director of the United States Patent and Trademark Office*